(12) United States Patent
Li

(10) Patent No.: US 7,239,512 B2
(45) Date of Patent: Jul. 3, 2007

(54) COMPUTER ENCLOSURE INCORPORATING HOOD FASTENING STRUCTURE

(75) Inventor: Tsung-Hsi Li, Tu-Cheng (TW)

(73) Assignee: Hon Hai Precision Industry Co., Ltd., Tu-cheng, Taipei Hsien (TW)

( * ) Notice: Subject to any disclaimer, the term of this patent is extended or adjusted under 35 U.S.C. 154(b) by 62 days.

(21) Appl. No.: 11/142,073

(22) Filed: Jun. 1, 2005

(65) Prior Publication Data
US 2005/0281004 A1 Dec. 22, 2005

(30) Foreign Application Priority Data
Jun. 16, 2004 (CN) .................. 2004 2 0047360

(51) Int. Cl.
*G06F 1/16* (2006.01)
(52) U.S. Cl. ............... 361/685; 312/223.2; 165/80.3
(58) Field of Classification Search ........ 361/679–687, 361/724–727; 174/16.1, 16.3; 165/80.3, 165/185; 348/207.1; 200/537; 312/223.2
See application file for complete search history.

(56) References Cited
U.S. PATENT DOCUMENTS
6,469,890 B1 * 10/2002 Gan ...................... 361/685

6,587,337 B2 * 7/2003 Sasaki ..................... 361/687
6,721,183 B1 * 4/2004 Chen et al. ................ 361/726

FOREIGN PATENT DOCUMENTS
TW          386613          4/2000

* cited by examiner

*Primary Examiner*—Hung Van Duong
(74) *Attorney, Agent, or Firm*—Morris Manning & Martin LLP; Tim Tingkang Xia, Esq.

(57) ABSTRACT

A computer enclosure of an embodiment of the present invention includes a chassis (30) and a hood (20). The chassis includes two side walls (32) and a front wall (34). The side walls each define a number of receiving holes (38) to slidably receive pins (28) of the hood. The front wall defines a number of V-shaped notches (33). The hood forms a number of retaining posts (24) corresponding to the notches of the chassis. Each retaining post defines a slanted side face. When the hood is pushed horizontally, the retaining posts and the notches cooperate to drive the hood downwardly so that the hood tightly abuts against the chassis.

20 Claims, 5 Drawing Sheets

COMPUTER ENCLOSURE INCORPORATING HOOD FASTENING STRUCTURE

BACKGROUND OF THE INVENTION

1. Field of the Invention

The present invention relates to computer enclosures, and particularly to a computer enclosure having a hood readily and closely attached thereto by means of fastening structure.

2. Background of the Invention

A conventional personal computer enclosure generally includes a chassis, a hood and a bezel. The chassis is generally U-shaped, and the hood is also U-shaped. The hood is often secured to the chassis by means of screwing a plurality of screws one by one. This process is unduly cumbersome and time-consuming.

Another conventional hood is disclosed in U.S. Pat. No. 6,721,183 B1. The hood includes a fastener having a number of components such as a handle, a latch and a spring. These components have relative complicated structure and increase manufacturing cost.

In attaching a hood to a computer chassis, the hood is often tilted or hunched at end portions, so that the attachment may be difficult or loose. Sometimes, manual work must be applied to depress the hood, to ease the attachment. However, this will make the assembly process labor-consuming, and results in inefficiency in mass production facilities.

What is needed therefore is to provide a computer enclosure having a hood readily and closely attached thereto by means of fastening structure.

SUMMARY

A computer enclosure in accordance with a preferred embodiment of the present invention is disclosed. The computer enclosure includes a chassis and a hood. The chassis includes two side walls and a front wall. The side walls each define a number of receiving holes to slidably receive pins of the hood. The front wall defines a plurality of V-shaped notches. The hood forms a plurality of retaining posts corresponding to the notches of the chassis. Each retaining post defines a slanted side face. When the hood is pushed horizontally, the retaining posts and the notches cooperate to drive the hood downwardly so that the hood tightly abuts against the chassis.

Other objects, advantages and novel features of the invention will become more apparent from the following detailed description when taken in conjunction with the accompanying drawings, in which:

DETAILED DESCRIPTION OF THE INVENTION

Figure 1:
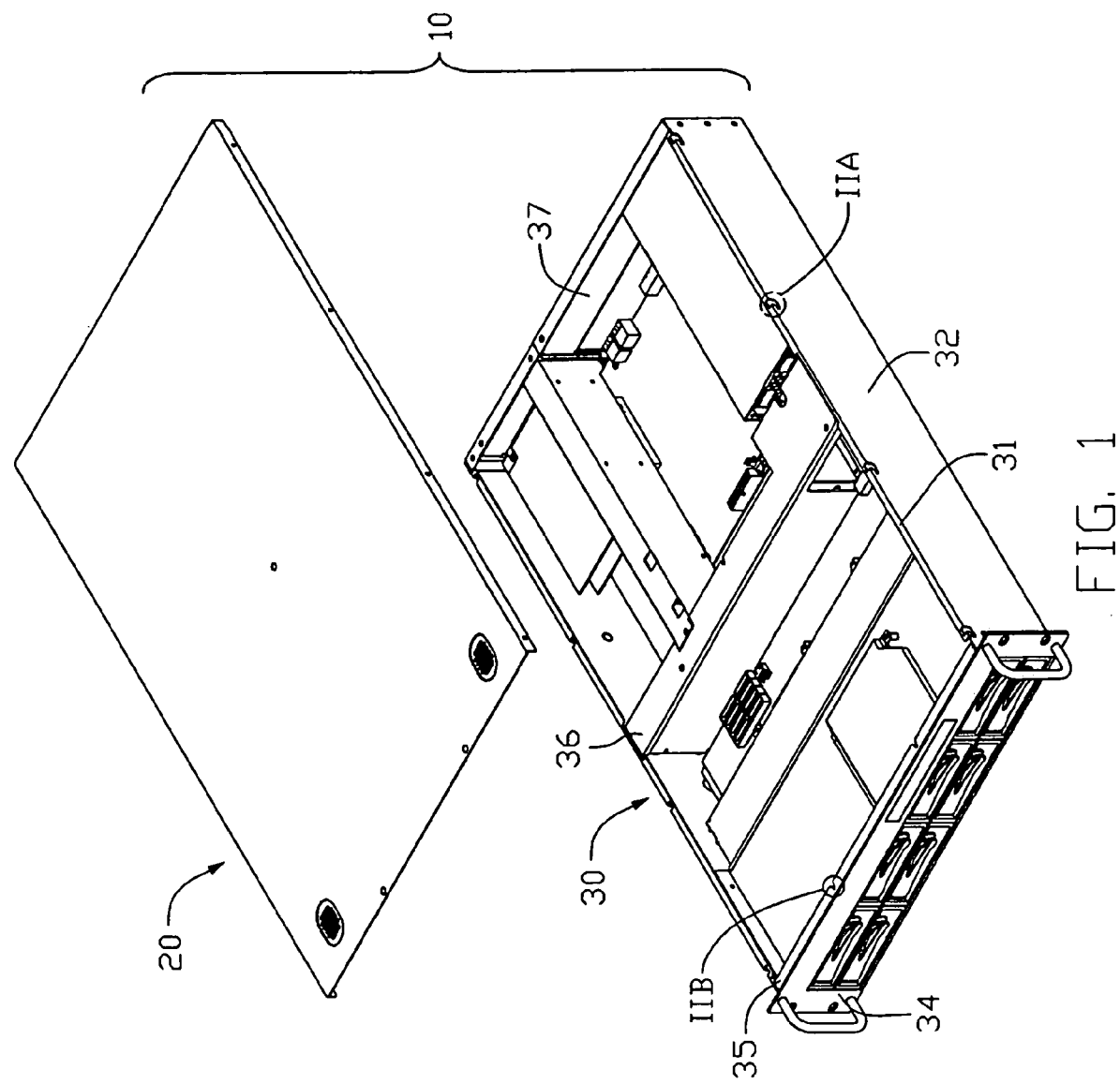
FIG. 1 is an exploded, isometric view showing a computer enclosure in accordance with a preferred embodiment of the present invention, the computer enclosure including a chassis and a hood.
Figure 2A:
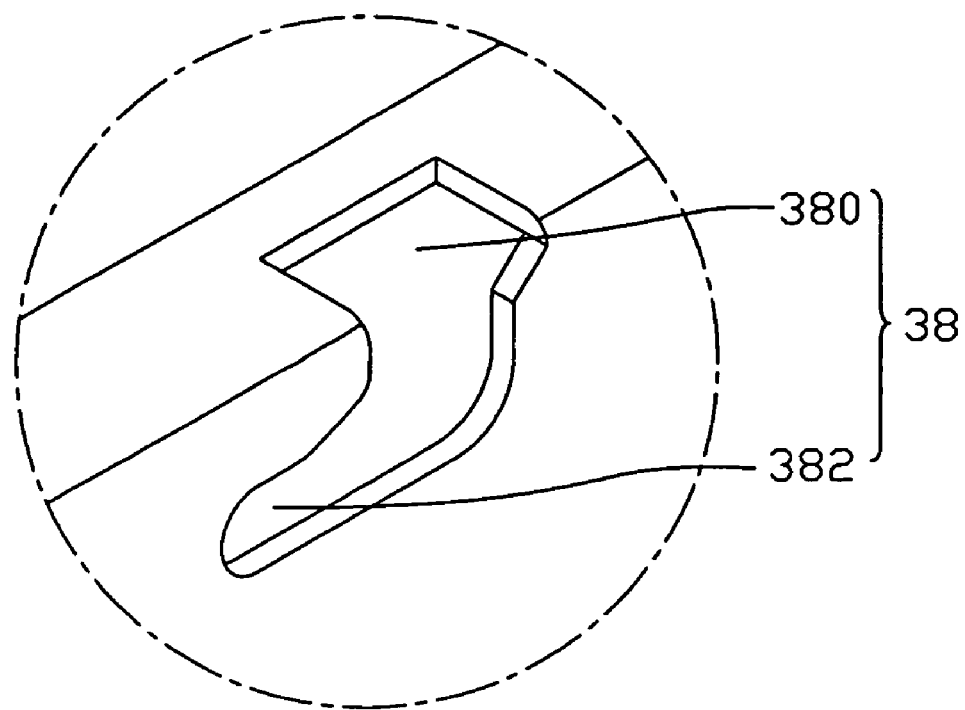
FIG. 2A is an enlarged view of an encircled portion IIA of FIG. 1.
Figure 2B:
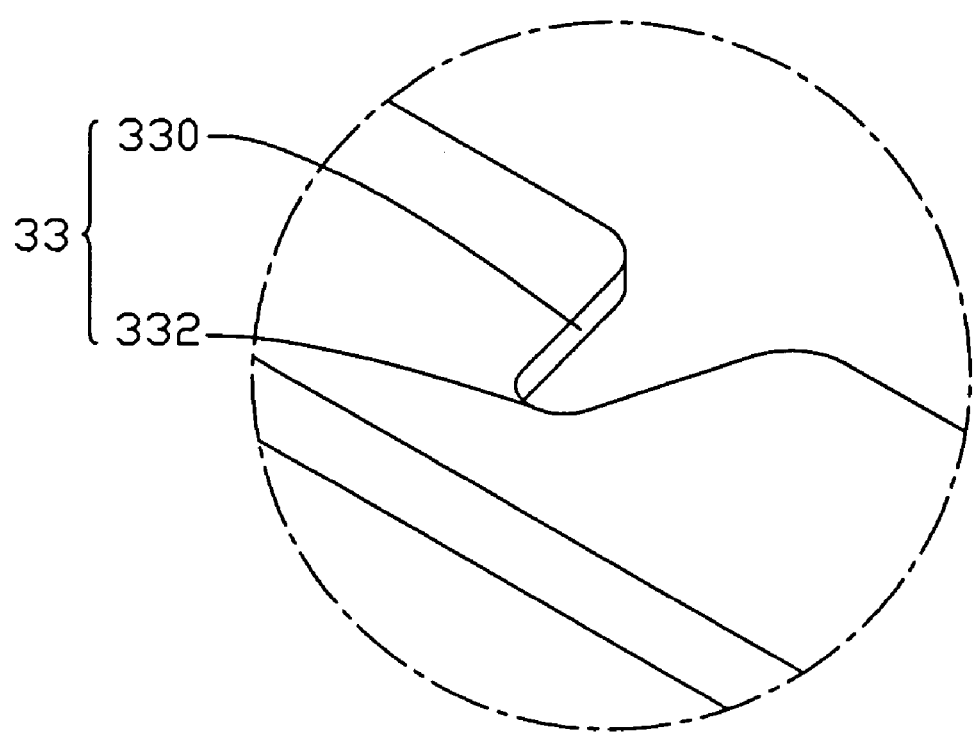
FIG. 2B is an enlarged view of an encircled portion IIB of FIG. 1.
Figure 3:
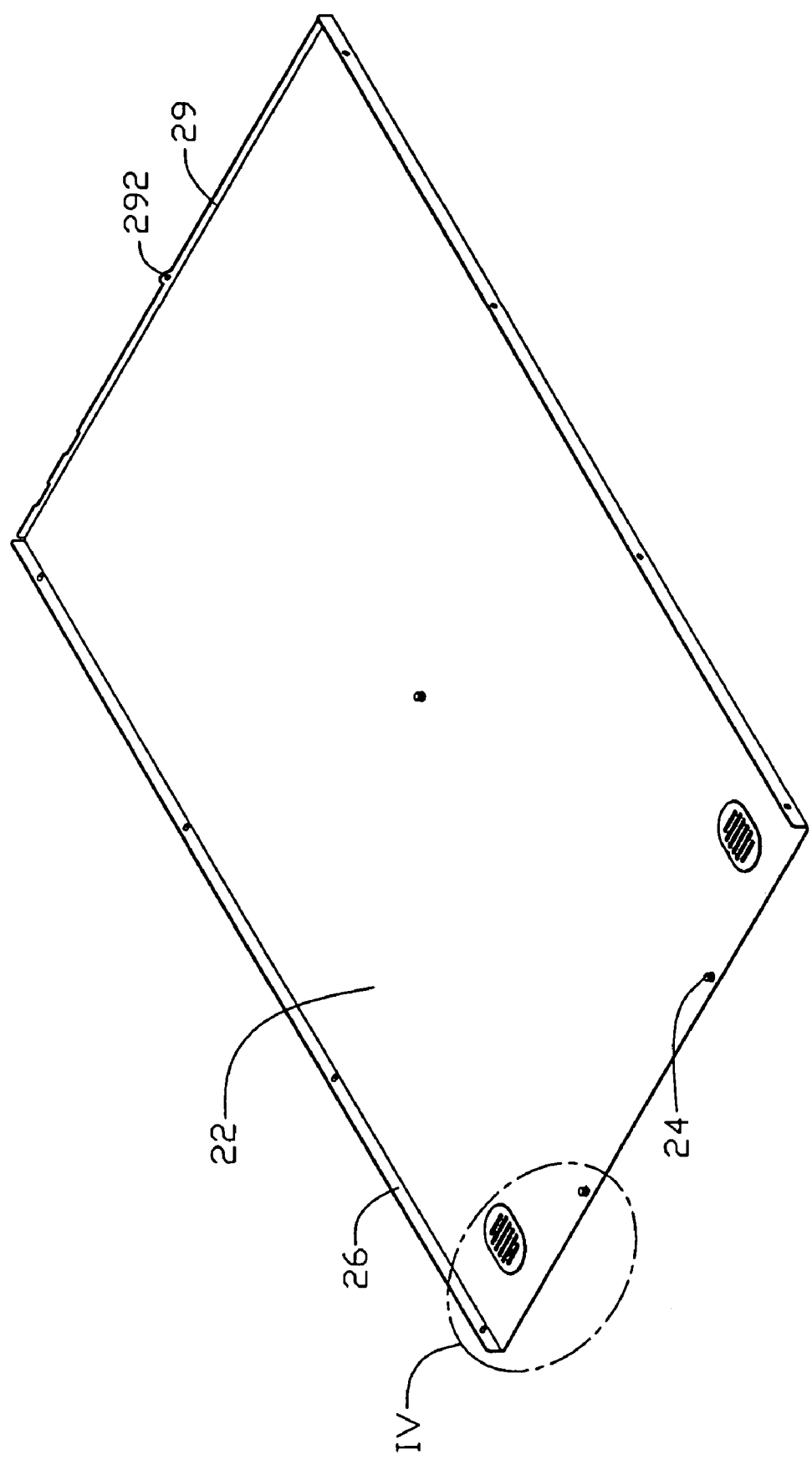
FIG. 3 is an isometric view of the hood of FIG. 1, but viewed from another aspect.
Figure 4:
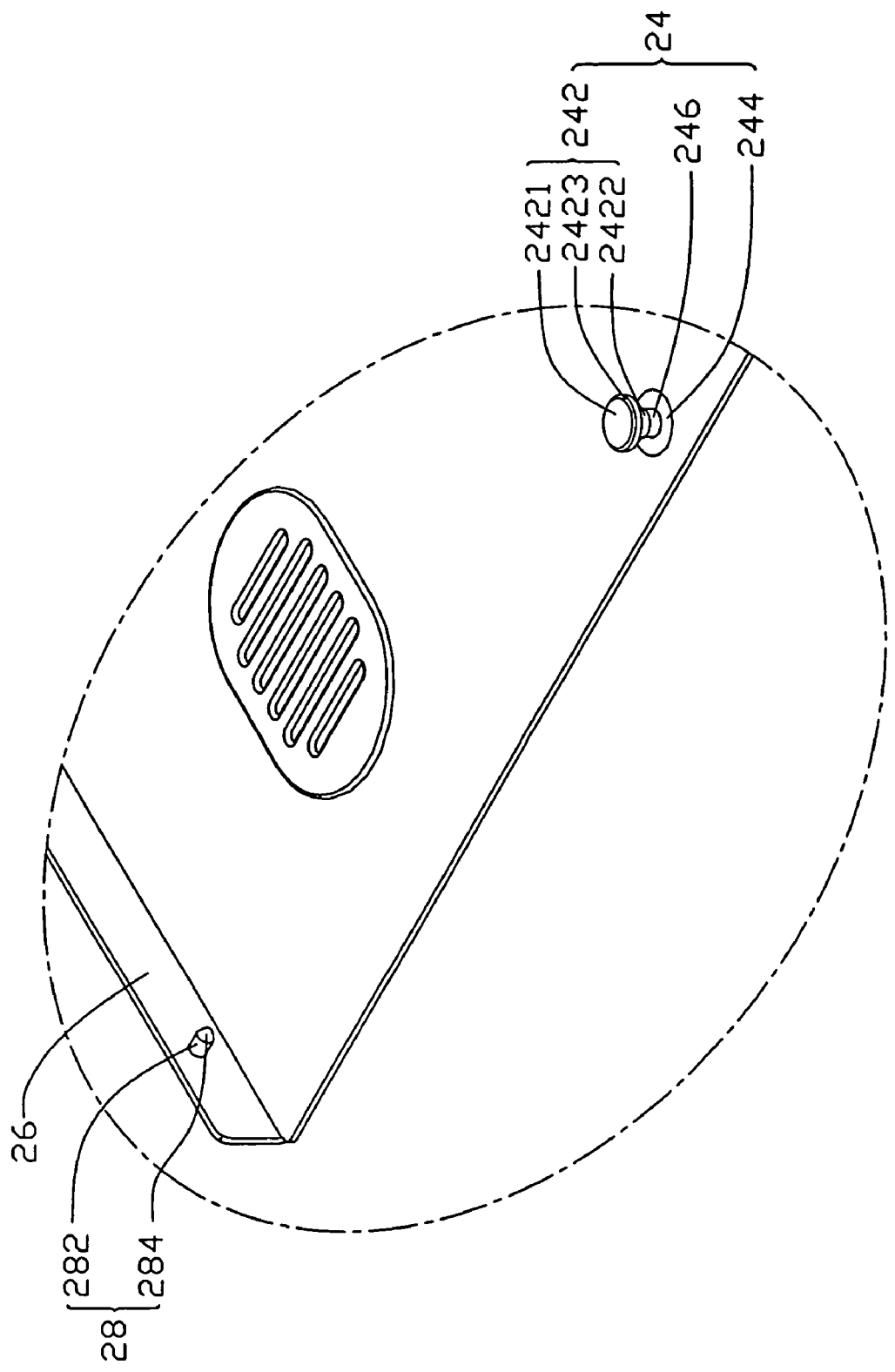
FIG. 4 is an enlarged view of an encircled portion IV of FIG. 3.
Figure 5:
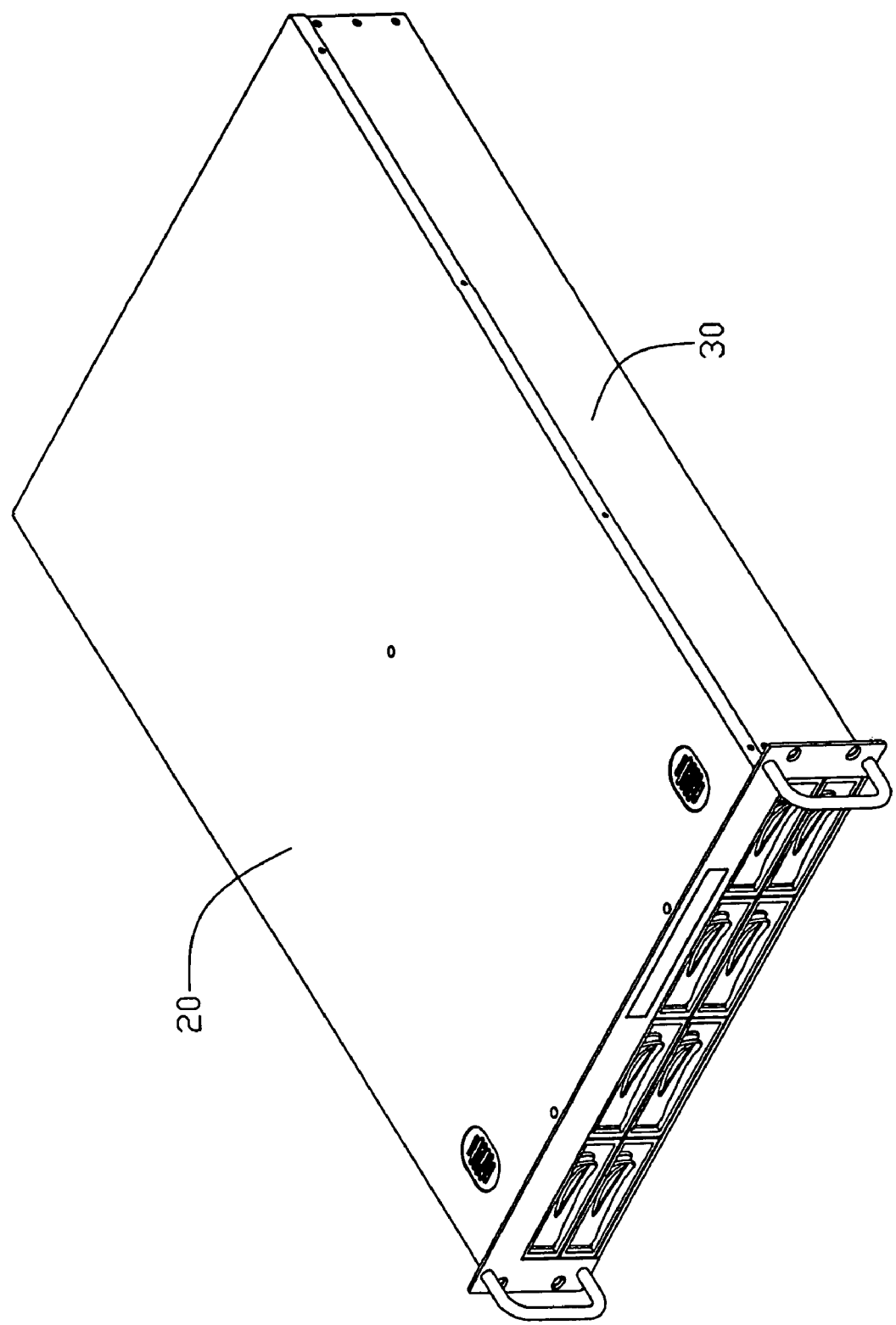
FIG. 5 is an assembled view of FIG. 1.

Referring to FIG. 1, an enclosure 10 of an electronic device like a computer in accordance with a preferred embodiment of the present invention includes a chassis 30 and a hood 20.

Referring also to FIGS. 2A, 2B, 3 and 4, the hood 20 is generally rectangular, and includes a main body 22, a pair of side flanges 26 perpendicularly bent from opposite side edges of the main body 22, and a rear flange 29 perpendicularly bent from a rear edge of the main body 22. Three fastening posts 24, used as fasteners for said hood 20, depend from an inner side of the main body 22. Two of the fastening posts 24 are located near a front edge of the hood 20, the third one of the fastening posts 24 is located near a middle of the hood 20. Each fastening post 24 includes fastening portion 242, a base portion 244, and a neck portion 246. The base portion 244 is connected to the main body 22; the neck portion 246 connects the base portion 244 and the fastening portion 242. The fastening portion 242 includes a cylindrical end section 2421, and a conical section 2422 connecting the end section 2421 to the neck portion 246. The end section 2421 forms a chamfer 243 in order not to injure users. A diameter of the end section 2421 is greater than that of the neck portion 246. A plurality of pins 28 extends perpendicularly inwardly from an inner surface of each side flange 26. Each pin 28 includes a cylindrical section 282 and a conical end 284. A through hole 292 is defined in the rear flange 29.

The chassis 30 is box-shaped, and generally holds components such as motherboards, interface cards, disk drives, etc. The chassis 30 includes two opposite side walls 32, a front wall 34, a partition wall 36, and a rear wall 37. A bent plate 31 is bent from a top edge of each side wall 32. A plurality of receiving holes 38 is defined in a junction of the bent plate 31 and the corresponding side wall 32. Each receiving hole 38 includes a first hole 380 defined in the bent plate 31, and a second hole 382 defined in the corresponding side wall 32 communicating with the first hole 380. A bent plate 35 is bent from a top edge of the front wall 34. Two V-shaped notches 33, used as corresponding fasteners to the fasteners of the hood 20, are defined in the bent plate 35 of the front wall 34; one V-shaped notch 33 is defined in the partition wall 36. Each notch 33 includes a pair of first edges 330, and a curved second edge 332 connecting the first edges 330. A radius of the second edge 332 is substantially equal to that of the neck portion 246 of the hood 20. A screw hole (invisible) is defined in the rear wall 37 corresponding to the through hole 292 of the rear flange 29 of the hood 20.

Referring to FIGS. 1-5, in assembly, the hood 20 is placed above the chassis 30 with the pins 28 of the hood 20 entering the first holes 380 of the receiving hole 38 of the chassis 30, and the fastening posts 24 of the hood 20 in alignment with the notches 33 of the chassis 30. Pushing the hood 20 forward, the first edges 330 of the notches 33 guide the conical sections 2422 of the fastening posts 24 so as to move the hood 20 downwardly, until the neck portions 246 of the fastening posts 24 are received in the notches 33. At the same time, the pins 28 of the hood 20 are received in the second holes 382 of the receiving holes 38 of the chassis 30. A thumb-screw (not shown) extends through the through hole 292 of the rear flange 29 of the hood 20, and engages in the screw hole of the rear wall 37 of the chassis 30. The hood 20 is thus closely attached to the chassis 30. In disassembly, the thumb-screw is unscrewed, the hood 20 is pushed rearwardly, so that the fastening posts 24 and the pins 28 of the hood 20 are released from the notches 33 and the receiving holes 38 of the chassis 30, respectively. The hood 20 is thus detached from the chassis 30.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

I claim:

1. A computer enclosure comprising:
   a chassis comprising two opposite side walls, and an upright wall, a plurality of receiving holes defined in the side walls, a plurality of notches defined in the upright wall; and
   a hood attached to the chassis, the hood comprising a plurality of pins to be slidably received in the receiving holes of the chassis, and a plurality of retaining posts corresponding to the notches of the chassis, wherein when the hood is pushed horizontally, the retaining posts and the notches cooperate to drive the hood downwardly so that the hood tightly abuts against the chassis.

2. The computer enclosure as claimed in claim 1, wherein the side walls and the upright wall each comprise a bent plate extending from a top edge thereof, the notches are defined in the bent plate of the upright wall.

3. The computer enclosure as claimed in claim 2, wherein each of the receiving holes comprises a first hole defined in the bent plate of a corresponding side wall, and a second hole defined in the corresponding side wall communicating with the first hole.

4. The computer enclosure as claimed in claim 3, wherein the pins are extended inwardly from side flanges of the hood.

5. The computer enclosure as claimed in claim 1, wherein each of the fastening posts comprises a fastening portion and a neck portion, the fastening portion comprises a cylindrical end section and a conical section, a diameter of the neck portion is smaller than that of the cylindrical end section, the conical section connects the cylindrical end section to the neck portion.

6. The computer enclosure as claimed in claim 5, wherein each of the notches is generally V-shaped, and comprises a pair of first edges, and a curved second edge connecting the first edges, a radius of the second edge is substantially equal to that of the neck portion of each of the fastening posts.

7. The computer enclosure as claimed in claim 1, wherein the upright wall comprises a front wall of the chassis, and a partition wall in a middle portion of the chassis, the front wall and the partition wall each connect the side walls.

8. The computer enclosure as claimed in claim 1, wherein the chassis further comprises a rear wall connecting the side walls, the rear wall defines a screw hole; and wherein the hood forms a rear flange defining a through hole corresponding to the screw hole of the rear wall.

9. computer enclosure comprising:
   a chassis forming a plurality of walls, at least one notch defined in at least one of the walls and extending along a horizontal direction, said notch defining a wide entrance and narrow end; and
   a hood attached to the chassis, the hood downwardly forming at least one fastening post, said fastening post comprising a neck portion and a fastening portion, the fastening portion defining a slanted side face cooperating with said notch to guide the hood downwardly during the course of the hood being pushed in said horizontal direction.

10. The computer enclosure as claimed in claim 9, wherein a diameter of the narrow end of said notch is substantially equal to that of the neck portion of said fastening portion.

11. The computer enclosure as claimed in claim 9, wherein said fastening post comprises a base portion being connected to the hood, the neck portion connects the fastening portion to the base portion.

12. The computer enclosure as claimed in claim 9, wherein the fastening portion of said fastening post comprises a cylindrical end section and a conical section connecting the cylindrical end section and the neck portion, a diameter of the neck portion is smaller than that of the cylindrical end section.

13. The computer enclosure as claimed in claim 9 wherein, the plurality of walls comprises a pair of side walls which forms top flanges to support the hood, a plurality of receiving holes is defined in the top flanges, a plurality of pins extends from the hood to be slidably received in the receiving holes.

14. The computer enclosure as claimed in claim 9, wherein The plurality of walls comprises a front wall and a partition wall, the front wall and the partition wall form top flanges to define the notches.

15. An electronic device comprising:
   a chassis partially enclosing said electronic device, and comprising at least one first fastener formed thereon; and
   a hood partially enclosing said electronic device so as to entirely enclose said electronic device in cooperation with said chassis, said hood having a second fastener corresponding to each of said at least one first fastener and engagably reachable to said each first fastener, engagement of said first and second fasteners being performed along a first predetermined direction and capable of urging movement of said hood toward said chassis along a second predetermined direction different from said first direction so as to fixedly attach said hood to said chassis.

16. The electronic device as claimed in claim 15, wherein said first fastener is a notch of said chassis, and said second fastener is a fastening post extending from said hood toward said chassis and engagable with said notch.

17. The electronic device as claimed in claim 16, wherein said fastening post comprises a base portion being connected to said hood, and a neck portion connecting a fastening portion of said fastening post to said base portion.

18. The electronic device as claimed in claim 17, wherein said fastening portion of said fastening post comprises a cylindrical end section and a conical section connecting said cylindrical end section and said neck portion, a diameter of said neck portion is smaller than that of said cylindrical end section.

19. The electronic device as claimed in claim 15, wherein said first predetermined direction is substantially perpendicular to said second predetermined direction.

20. The electronic device as claimed in claim 15, wherein one of said first and second fasteners comprises a V-shaped notch defined along said first predetermined direction, the other of said first and second fasteners comprises a conical section extending along said second predetermined direction.

* * * * *